(12) United States Patent
Tanaka et al.

(10) Patent No.: US 7,830,007 B2
(45) Date of Patent: Nov. 9, 2010

(54) ELECTRONIC DEVICE, METHOD OF PRODUCING THE SAME, AND SEMICONDUCTOR DEVICE

(75) Inventors: Shuichi Tanaka, Chino (JP); Haruki Ito, Chino (JP)

(73) Assignee: Seiko Epson Corporation (JP)

( * ) Notice: Subject to any disclaimer, the term of this patent is extended or adjusted under 35 U.S.C. 154(b) by 304 days.

(21) Appl. No.: 12/181,536

(22) Filed: Jul. 29, 2008

(65) Prior Publication Data
US 2009/0032944 A1 Feb. 5, 2009

(30) Foreign Application Priority Data
Jul. 30, 2007 (JP) .............................. 2007-197174

(51) Int. Cl.
*H01L 23/52* (2006.01)
*H01L 23/48* (2006.01)
*H01L 29/40* (2006.01)

(52) U.S. Cl. .............................. 257/738; 257/E23.142; 257/737; 257/778; 257/780; 438/118

(58) Field of Classification Search .......... 257/E21.499, 257/E23.142, 737, 738, 780, 781, 783, 778; 361/783; 438/118
See application file for complete search history.

(56) References Cited

U.S. PATENT DOCUMENTS

| 6,277,669 | B1 * | 8/2001 | Kung et al. | 438/106 |
|---|---|---|---|---|
| 6,587,353 | B2 * | 7/2003 | Sumikawa et al. | 361/760 |
| 6,936,928 | B2 * | 8/2005 | Hedler et al. | 257/778 |
| 7,161,245 | B2 * | 1/2007 | Saito | 257/737 |
| 7,312,533 | B2 * | 12/2007 | Haimerl et al. | 257/779 |
| 7,524,700 | B2 * | 4/2009 | Tanaka | 438/117 |
| 7,534,652 | B2 * | 5/2009 | Haba et al. | 438/108 |
| 7,573,140 | B2 * | 8/2009 | Neishi | 257/780 |
| 7,601,626 | B2 * | 10/2009 | Tanaka | 438/612 |
| 7,714,436 | B2 * | 5/2010 | Tanaka | 257/737 |
| 2005/0006788 | A1 * | 1/2005 | Kaneko | 257/778 |
| 2006/0286790 | A1 * | 12/2006 | Yamasaki et al. | 438/612 |
| 2007/0001200 | A1 * | 1/2007 | Imai et al. | 257/288 |
| 2007/0015363 | A1 | 1/2007 | Hashimoto | 438/689 |
| 2007/0029652 | A1 * | 2/2007 | Asakawa et al. | 257/667 |
| 2007/0057371 | A1 * | 3/2007 | Hashimoto | 257/738 |
| 2007/0063345 | A1 * | 3/2007 | Hashimoto | 257/737 |

FOREIGN PATENT DOCUMENTS

| JP | 02-272737 | 11/1990 |
|---|---|---|
| JP | 2744476 | 2/1998 |
| JP | 2003-338524 | 11/2003 |
| JP | 2007-027307 | 2/2007 |
| JP | 2007-048971 | 2/2007 |

* cited by examiner

*Primary Examiner*—Chris Chu
(74) *Attorney, Agent, or Firm*—Harness, Dickey & Pierce, P.L.C.

(57) ABSTRACT

A semiconductor device includes $n_1$ first interconnects (n is an integer larger than one) respectively formed on first electrodes and extending over a first resin protrusion, and $n_2$ second interconnects ($n_2 < n_1$) respectively formed on second electrodes and extending over a second resin protrusion. The first and second resin protrusions are formed of an identical material, have an identical width, and extend longitudinally. The first interconnects extends to intersect a longitudinal axis of the first resin protrusion, and each of the first interconnects has a first width $W_1$ on the first resin protrusion. The second interconnects extends to intersect a longitudinal axis of the second resin protrusion, and each of the second interconnects has a second width $W_2$ ($W_1 < W_2$) on the second resin protrusion. The relationship $W_1 \times n_1 = W_2 \times n_2$ is satisfied.

9 Claims, 6 Drawing Sheets

ELECTRONIC DEVICE, METHOD OF PRODUCING THE SAME, AND SEMICONDUCTOR DEVICE

Japanese Patent Application No. 2007-197174, filed on Jul. 30, 2007, is hereby incorporated by reference in its entirety.

BACKGROUND OF THE INVENTION

The present invention relates to an electronic device, a method of producing the same, and a semiconductor device.

JP-A-2-272737 discloses technology that forms a resin protrusion on an active surface of a semiconductor chip, and forms an interconnect from an electrode on the active surface to extend over the resin protrusion to form a bump electrode. According to this technology, stress can be reduced by the resin protrusion while providing the bump electrodes at a pitch (center-to-center distance) and an arrangement differing from those of the electrodes. Japanese Patent No. 2744476 discloses technology that mounts a semiconductor device having bump electrodes on a circuit board utilizing an adhesive. When the semiconductor device is mounted on the circuit board, a resin protrusion under the bump electrode is compressed between the semiconductor chip and the circuit board, and an interconnect of the bump electrode comes in contact with an interconnect of the circuit board under pressure due to the elasticity of the resin protrusion.

The technology disclosed in JP-A-2-272737 may be applied to a semiconductor device (e.g., liquid crystal driver) in which the number of input terminals differs to a large extent from the number of output terminals, and the semiconductor device may be mounted on a liquid crystal panel as disclosed in Japanese Patent No. 2744476. In this case, since the number of bump electrodes differs to a large extent between the input side and the output side, a resin protrusion provided on the side where the number of bump electrodes is small is deformed to a large extent while a resin protrusion provided on the side where the number of bump electrodes is large is deformed to only a small extent. Therefore, when the resin protrusion on the side where the number of bump electrodes is large is designed to exhibit a desired elasticity, the resin protrusion provided on the side where the number of bump electrodes is small is deformed to a large extent.

SUMMARY

According to a first aspect of the invention, there is provided a semiconductor device comprising:

a semiconductor substrate on which an integrated circuit is formed, a surface of the semiconductor substrate being divided into a first area and a second area by a straight line that passes through the center of the surface of the semiconductor substrate;

a plurality of first electrodes and a plurality of second electrodes formed on the semiconductor substrate so that the first and second electrodes are electrically connected to the integrated circuit;

at least one first resin protrusion disposed in the first area;

at least one second resin protrusion disposed in the second area, the first and second resin protrusions being formed of an identical material, having an identical width, and extending longitudinally;

$n_1$ first interconnects (n is an integer larger than one) respectively formed on the first electrodes and extending over the first resin protrusion to intersect a longitudinal axis of the first resin protrusion, each of the $n_1$ first interconnects having a first width $W_1$ on the first resin protrusion; and $n_2$ second interconnects ($n_2 < n_1$) respectively formed on the second electrodes and extending over the second resin protrusion to intersect a longitudinal axis of the second resin protrusion, each of the $n_2$ second interconnects having a second width $W_2$ ($W_1 < W_2$) on the second resin protrusion, and the relationship $W_1 \times n_1 = W_2 \times n_2$ being satisfied.

According to a second aspect of the invention, there is provided an electronic device comprising a semiconductor, the semiconductor device including:

a semiconductor substrate on which an integrated circuit is formed, a surface of the semiconductor substrate being divided into a first area and a second area by a straight line that passes through the center of the surface of the semiconductor substrate;

a plurality of first electrodes and a plurality of second electrodes formed on the semiconductor substrate so that the first and second electrodes are electrically connected to the integrated circuit;

at least one first resin protrusion disposed in the first area;

at least one second resin protrusion disposed in the second area, the first and second resin protrusions being formed of an identical material, having an identical width, and extending longitudinally;

$n_1$ first interconnects (n is an integer larger than one) respectively formed on the first electrodes and extending over the first resin protrusion to intersect a longitudinal axis of the first resin protrusion, each of the $n_1$ first interconnects having a first width $W_1$ on the first resin protrusion; and $n_2$ second interconnects ($n_2 < n_1$) respectively formed on the second electrodes and extending over the second resin protrusion to intersect a longitudinal axis of the second resin protrusion, each of the $n_2$ second interconnects having a second width $W_2$ ($W_1 < W_2$) on the second resin protrusion, and the relationship $W_1 \times n_1 = W_2 \times n_2$ being satisfied; and the electric device further comprising:

a circuit board on which an interconnect pattern is formed and the semiconductor device is mounted, the interconnect pattern being faced with and electrically connected to the first interconnects and the second interconnects; and an adhesive provided between the semiconductor device and the circuit board.

According to a third aspect of the invention, there is provided a method of producing an electronic device comprising:

mounting a semiconductor device on a circuit board on which an interconnect pattern is formed, the semiconductor device including:

a semiconductor substrate on which an integrated circuit is formed, a surface of the semiconductor substrate being divided into a first area and a second area by a straight line that passes through the center of the surface of the semiconductor substrate;

a plurality of first electrodes and a plurality of second electrodes formed on the semiconductor substrate so that the first and second electrodes are electrically connected to the integrated circuit;

at least one first resin protrusion disposed in the first area;

at least one second resin protrusion disposed in the second area, the first and second resin protrusions being formed of an identical material, having an identical width, and extending longitudinally;

$n_1$ first interconnects (n is an integer larger than one) respectively formed on the first electrodes and extending over the first resin protrusion to intersect a longitudinal axis of the first resin protrusion, each of the $n_1$ first interconnects having a first width $W_1$ on the first resin protrusion; and $n_2$ second interconnects ($n_2 < n_1$) respectively formed on the second electrodes and extending over the second resin protrusion to intersect a longitudinal axis of the second resin protrusion, each of the $n_2$ second interconnects having a second width $W_2$ ($W_1 < W_2$) on the second resin protrusion, and the relationship $W_1 \times n_1 = W_2 \times n_2$ being satisfied;

the method further comprising:

causing the interconnect pattern to be faced with the first and second interconnects and electrically connecting the interconnect pattern to the first and second interconnects; and bonding the semiconductor device and the circuit board through an adhesive.

DETAILED DESCRIPTION OF THE EMBODIMENT

Figure 1:
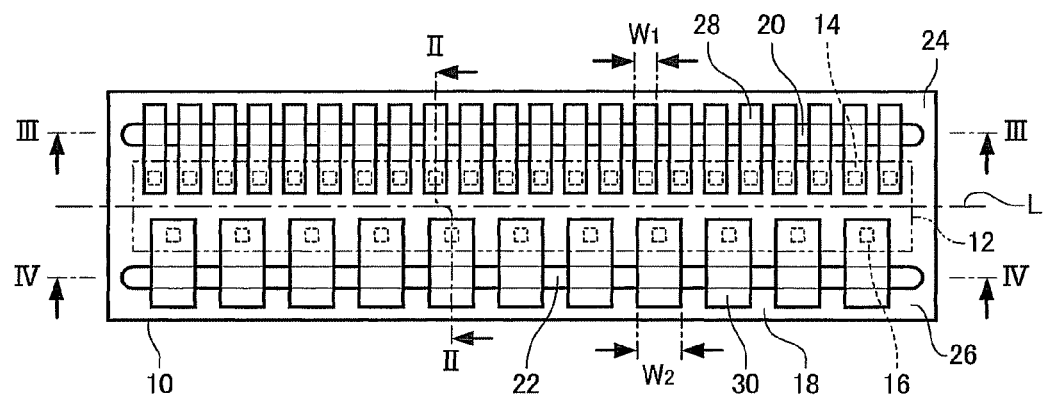
FIG. 1 is a plan view showing a semiconductor device according to a first embodiment of the invention.

The invention may provide reduction of a difference between amounts by which resin protrusions are deformed in a semiconductor device having terminals formed by providing interconnects on the resin protrusions, even if different numbers of terminals are arranged in a pair of areas.

(1) According to one embodiment of the invention, there is provided a semiconductor device comprising:

a semiconductor substrate on which an integrated circuit is formed, a surface of the semiconductor substrate being divided into a first area and a second area by a straight line that passes through the center of the surface of the semiconductor substrate;

a plurality of first electrodes and a plurality of second electrodes formed on the semiconductor substrate so that the first and second electrodes are electrically connected to the integrated circuit;

at least one first resin protrusion disposed in the first area;

at least one second resin protrusion disposed in the second area, the first and second resin protrusions being formed of an identical material, having an identical width, and extending longitudinally;

$n_1$ first interconnects (n is an integer larger than one) respectively formed on the first electrodes and extending over the first resin protrusion to intersect a longitudinal axis of the first resin protrusion, each of the $n_1$ first interconnects having a first width $W_1$ on the first resin protrusion; and $n_2$ second interconnects ($n_2 < n_1$) respectively formed on the second electrodes and extending over the second resin protrusion to intersect a longitudinal axis of the second resin protrusion, each of the $n_2$ second interconnects having a second width $W_2$ ($W_1 < W_2$) on the second resin protrusion, and the relationship $W_1 \times n_1 = W_2 \times n_2$ being satisfied.

According to this embodiment, the number ($n_1$) of terminals formed using the first resin protrusion and the first interconnects is larger than the number ($n_2$) of terminals formed using the second resin protrusion and the second interconnects. However, since the first width $W_1$ is smaller than the second width $W_2$ and the relationship $W_1 \times n_1 = W_2 \times n_2$ is satisfied, the difference between the amount by which the first resin protrusion is deformed and the amount by which the second resin protrusion is deformed can be reduced.

(2) In this semiconductor device, the first interconnects may be spaced and formed on an upper surface of the first resin protrusion opposite to the semiconductor substrate;

the second interconnects may be spaced and formed on an upper surface of the second resin protrusion opposite to the semiconductor substrate;

part of the upper surface of the first resin protrusion between every adjacent two of the first interconnects may be formed to be closer to the semiconductor substrate than part of the upper surface of the first resin protrusion directly under the first interconnects; and part of the upper surface of the second resin protrusion between every adjacent two of the second interconnects may be formed to be closer to the semiconductor substrate than part of the upper surface of the second resin protrusion directly under the second interconnects.

(3) In this semiconductor device, the first resin protrusion may be formed to have a bottom surface that is larger than the upper surface of the first resin protrusion; and the second resin protrusion may be formed to have a bottom surface that is larger than the upper surface of the second resin protrusion.

(4) In this semiconductor device, the semiconductor substrate may have a shape of a rectangle;

the first resin protrusion may be disposed so that a first side of the rectangle is closest to the first resin protrusion among the sides of the rectangle; and the second resin protrusion may be disposed so that a second side of the rectangle that is opposite to the first side is closest to the second resin protrusion among the sides of the rectangle.

(5) According to one embodiment of the invention, there is provided an electronic device comprising a semiconductor, the semiconductor device including:

a semiconductor substrate on which an integrated circuit is formed, a surface of the semiconductor substrate being divided into a first area and a second area by a straight line that passes through the center of the surface of the semiconductor substrate;

a plurality of first electrodes and a plurality of second electrodes formed on the semiconductor substrate so that the first and second electrodes are electrically connected to the integrated circuit;

at least one first resin protrusion disposed in the first area;

at least one second resin protrusion disposed in the second area, the first and second resin protrusions being formed of an identical material, having an identical width, and extending longitudinally;

$n_1$ first interconnects (n is an integer larger than one) respectively formed on the first electrodes and extending over the first resin protrusion to intersect a longitudinal axis of the first resin protrusion, each of the $n_1$ first interconnects having a first width $W_1$ on the first resin protrusion; and $n_2$ second interconnects ($n_2<n_1$) respectively formed on the second electrodes and extending over the second resin protrusion to intersect a longitudinal axis of the second resin protrusion, each of the $n_2$ second interconnects having a second width $W_2$ ($W_1<W_2$) on the second resin protrusion, and the relationship $W_1 \times n_1 = W_2 \times n_2$ being satisfied; and the electric device further comprising:

a circuit board on which an interconnect pattern is formed and the semiconductor device is mounted, the interconnect pattern being faced with and electrically connected to the first interconnects and the second interconnects; and an adhesive provided between the semiconductor device and the circuit board.

According to this embodiment, the number ($n_1$) of terminals formed using the first resin protrusion and the first interconnects is larger than the number ($n_2$) Of terminals formed using the second resin protrusion and the second interconnects. However, since the first width $W_1$ is smaller than the second width $W_2$ and the relationship $W_1 \times n_1 = W_2 \times n_2$ is satisfied, the difference between the amount by which the first resin protrusion is deformed and the amount by which the second resin protrusion is deformed can be reduced.

(6) In this electronic device, the first resin protrusion and the second resin protrusion may be compressed in a direction in which the semiconductor device and the circuit board are faced with each other.

(7) In this electronic device, the first interconnects may be spaced and formed on an upper surface of the first resin protrusion opposite to the semiconductor substrate;

the second interconnects may be spaced and formed on an upper surface of the second resin protrusion opposite to the semiconductor substrate;

part of the upper surface of the first resin protrusion between every adjacent two of the first interconnects may be formed to be closer to the semiconductor substrate than part of the upper surface of the first resin protrusion directly under the first interconnects;

part of the upper surface of the second resin protrusion between every adjacent two of the second interconnects may be formed to be closer to the semiconductor substrate than part of the upper surface of the second resin protrusion directly under the second interconnects; and part of the upper surface of the first resin protrusion between every adjacent two of the first interconnects and part of the upper surface of the second resin protrusion between every adjacent two of the second interconnects may be apart from the circuit board.

(8) According to one embodiment of the invention, there is provided a method of producing an electronic device comprising:

mounting a semiconductor device on a circuit board on which an interconnect pattern is formed, the semiconductor device including:

a semiconductor substrate on which an integrated circuit is formed, a surface of the semiconductor substrate being divided into a first area and a second area by a straight line that passes through the center of the surface of the semiconductor substrate;

a plurality of first electrodes and a plurality of second electrodes formed on the semiconductor substrate so that the first and second electrodes are electrically connected to the integrated circuit;

at least one first resin protrusion disposed in the first area;

at least one second resin protrusion disposed in the second area, the first and second resin protrusions being formed of an identical material, having an identical width, and extending longitudinally;

$n_1$ first interconnects (n is an integer larger than one) respectively formed on the first electrodes and extending over the first resin protrusion to intersect a longitudinal axis of the first resin protrusion, each of the $n_1$ first interconnects having a first width $W_1$ on the first resin protrusion; and $n_2$ second interconnects ($n_2<n_1$) respectively formed on the second electrodes and extending over the second resin protrusion to intersect a longitudinal axis of the second resin protrusion, each of the $n_2$ second interconnects having a second width $W_2$ ($W_1<W_2$) on the second resin protrusion, and the relationship $W_1 \times n_1 = W_2 \times n_2$ being satisfied;

the method further comprising:

causing the interconnect pattern to be faced with the first and second interconnects and electrically connecting the interconnect pattern to the first and second interconnects; and bonding the semiconductor device and the circuit board through an adhesive.

According to this embodiment, the number ($n_1$) of terminals formed using the first resin protrusion and the first interconnects is larger than the number ($n_2$) of terminals formed using the second resin protrusion and the second interconnects. However, since the first width $W_1$ is smaller than the second width $W_2$ and the relationship $W_1 \times n_1 = W_2 \times n_2$ is satisfied, the difference between the amount by which the first resin protrusion is deformed and the amount by which the second resin protrusion is deformed can be reduced.

(9) In this method of producing an electronic device, the first resin protrusion and the second resin protrusion may be compressed in a direction in which the semiconductor device and the circuit board are faced with each other when mounting the semiconductor device on the circuit board; and the adhesive may be cured in the step of bonding the semiconductor device and the circuit board through the adhesive in a state in which the first resin protrusion and the second resin protrusion are compressed.

Figure 2:
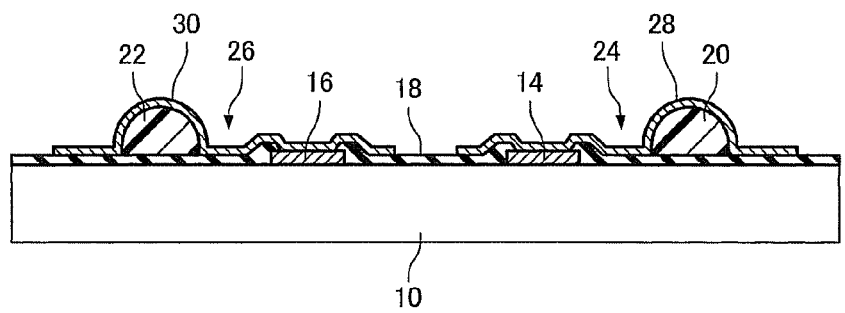
FIG. 2 is a cross-sectional view of the semiconductor device shown in FIG. 1 taken along the line II-II.
Figure 3:
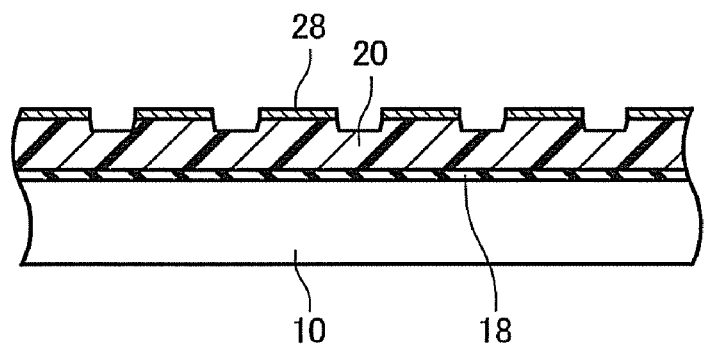
FIG. 3 is a cross-sectional view of the semiconductor device shown in FIG. 1 taken along the line III-III.
Figure 4:
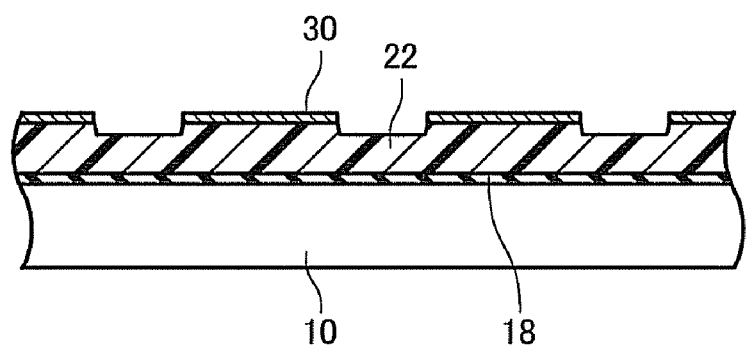
FIG. 4 is a cross-sectional view of the semiconductor device shown in FIG. 1 along the line IV-IV.

FIG. 1 is a plan view showing a semiconductor device according to a first embodiment of the invention. FIG. 2 is a cross-sectional view of the semiconductor device shown in FIG. 1 taken along the line II-II, FIG. 3 is a cross-sectional view of the semiconductor device shown in FIG. 1 taken along the line III-III, and FIG. 4 is a cross-sectional view of the semiconductor device shown in FIG. 1 taken along the line IV-IV.

The semiconductor device includes a semiconductor substrate 10. When the semiconductor substrate 10 is a semiconductor chip, the semiconductor substrate 10 has a rectangular surface. When the semiconductor substrate 10 is a semiconductor wafer, each area corresponding to a semiconductor chip has a rectangular surface. An integrated circuit 12 (e.g., transistors) is formed on the semiconductor substrate 10 (i.e., one semiconductor chip or each area corresponding to a semiconductor chip). A plurality of first electrodes 14 and a plurality of second electrodes 16 are formed on the semiconductor substrate 10 so that the first electrodes 14 and the second electrodes 16 are electrically connected to the integrated circuit 12. The first electrodes 14 are arranged in one row or a plurality of rows (a plurality of parallel rows). The second electrodes 16 are arranged in one row or a plurality of rows (a plurality of parallel rows). A row of the first electrodes 14 and a row of the second electrodes 16 are spaced and arranged in parallel. The first electrodes 14 are arranged along (parallel to) a first side of the rectangular surface of the semiconductor substrate 10, and the second electrodes 16 are arranged along (parallel to) a second side (i.e., the side opposite to the first side) of the rectangular surface of the semiconductor substrate 10. The first electrodes 14 and the second electrodes 16 are electrically connected to the integrated circuit 12 through internal interconnects (not shown).

A passivation film 18 is formed on the semiconductor substrate 10 so that the first electrodes 14 and the second electrodes 16 are at least partially exposed. The passivation film 18 may be formed only of an inorganic material (e.g., $SiO_2$ or SiN), for example. The passivation film 18 is formed over the integrated circuit 12.

At least one first resin protrusion 20 and at least one second resin protrusion 22 are formed on the semiconductor substrate 10. At least one first resin protrusion 20 is disposed in a first area 24 on the surface (rectangular surface) of the semiconductor substrate 10, the surface of the semiconductor substrate 10 being divided into the first area 24 and a second area 26 by a straight line L that passes through the center of the surface of the semiconductor substrate 10. At least one second resin protrusion 22 is disposed in the second area 26. The straight line L is parallel to the side of the rectangular surface (the long side when the rectangular surface is not square).

The first resin protrusion 20 and the second resin protrusion 22 have an identical width and extend longitudinally. The first resin protrusion 20 widens toward the bottom so that the bottom surface is larger than the upper surface. The second resin protrusion 22 also widens toward the bottom so that the bottom surface is larger than the upper surface. The first resin protrusion 20 is disposed at a position close to the first side (long side) among the sides of the rectangular surface. The second resin protrusion 22 is disposed at a position close to the second side (long side) among the sides of the rectangular surface, the second side being opposite to the first side.

The first resin protrusion 20 and the second resin protrusion 22 are formed of an identical material. For example, the first resin protrusion 20 and the second resin protrusion 22 may be formed of a resin such as a polyimide resin, a silicone-modified polyimide resin, an epoxy resin, a silicone-modified epoxy resin, benzocyclobutene (BCB), polybenzoxazole (PBO), or a phenol resin.

$n_1$ first interconnects 28 are formed on the semiconductor substrate 10. The first interconnects 28 are respectively formed from the first electrodes 14 to extend over the first resin protrusion 20. The first interconnects 28 are spaced and formed on the upper surface of the first resin protrusion 20 opposite to the semiconductor substrate 10. The first interconnects 28 extend to intersect the longitudinal axis of the first resin protrusion 20, and have a first width $W_1$ on the first resin protrusion 20.

$n_2$ ($n_2 < n_1$) second interconnects 30 are formed on the semiconductor substrate 10. The second interconnects 30 are respectively formed from the second electrodes 16 to extend over the second resin protrusion 22. The second interconnects 30 are spaced and formed on the upper surface of the second resin protrusion 22 opposite to the semiconductor substrate 10. The second interconnects 30 extend to intersect the longitudinal axis of the second resin protrusion 22, and have a second width $W_2$ ($W_1 < W_2$) on the second resin protrusion 22. The relationship $W_1 \times n_1 = W_2 \times n_2$ is satisfied.

The first interconnects 28 and the second interconnects 30 extend over the passivation film 18 from the first electrodes 14 or the second electrodes 16 and reach the first resin protrusion 20 or the second resin protrusion 22. The first interconnects 28 and the second interconnects 30 may be in contact with the first electrodes 14 or the second electrodes 16 either directly or through a conductive film (not shown). The first interconnects 28 and the second interconnects 30 are formed to extend over the passivation film 18 across the end of the first resin protrusion 20 or the second resin protrusion 22 opposite to the first electrodes 14 or the second electrodes 16.

As shown in FIG. 3, the upper surface of the first resin protrusion 20 is formed so that the areas between the adjacent first interconnects 28 are closer to the semiconductor substrate 10 than the areas directly under the first interconnects 28. As shown in FIG. 4, the upper surface of the second resin protrusion 22 is formed so that the areas between the adjacent second interconnects 30 are closer to the semiconductor substrate 10 than the areas directly under the second interconnects 30. Specifically, the upper surfaces of the first resin protrusion 20 and the second resin protrusion 22 are formed so that the areas that do not overlap the first interconnects 28 or the second interconnects 30 are lower than the areas that overlap the first interconnects 28 or the second interconnects 30. This facilitates achieving electrical connection by increasing the height of external terminals for the first interconnects 28 and the second interconnects 30. The above-described shape is obtained by forming the first interconnects 28 and the second interconnects 30 on the first resin protrusion 20 and the second resin protrusion 22, respectively, etching the areas of the first resin protrusion 20 between the adjacent first interconnects 28, and etching the areas of the second resin protrusion 22 between the adjacent second interconnects 30.

Figure 5A:
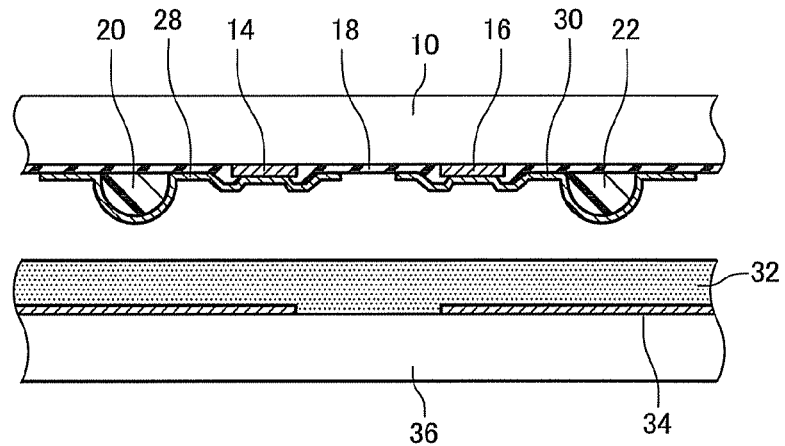
FIGS. 5A to 5C are diagrams illustrative of a method of producing an electronic device according to the first embodiment of the invention.
Figure 5B:
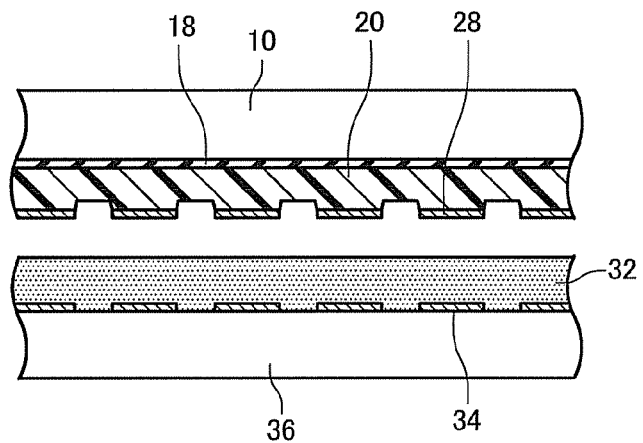
Figure 5C:
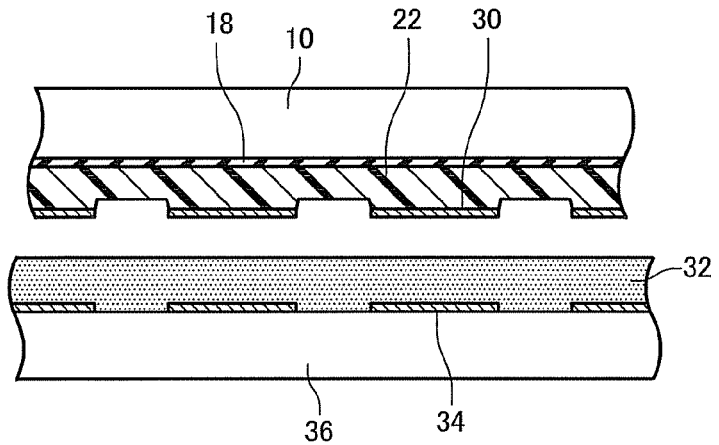

FIGS. 5A to 5C are diagrams illustrative of a method of producing an electronic device according to the first embodiment of the invention. Note that the cross section of the semiconductor device shown in FIG. 5A corresponds to the cross section along the line II-II in FIG. 1 (FIG. 2), the cross section of the semiconductor device shown in FIG. 5B corresponds to the cross section along the line III-III in FIG. 1 (FIG. 3), and the cross section of the semiconductor device shown in FIG. 5C corresponds to the cross section along the line IV-IV in FIG. 1 (FIG. 4).

In this embodiment, the above-described semiconductor device is disposed on a circuit board 36 having an interconnect pattern 34 through a heat-curable adhesive 32. Specifically, the semiconductor device is mounted on the circuit board 36 on which the interconnect pattern 34 is formed. The semiconductor device is disposed so that the first interconnects 28 and the second interconnects 30 provided on the first resin protrusion 20 and the second resin protrusion 22 face the interconnect pattern 34. The first interconnects 28 and the second interconnects 30 are electrically connected to the interconnect pattern 34. The circuit board 36 may be a circuit board of a liquid crystal panel or an organic EL panel. A substrate that supports the interconnect pattern 34 may be formed of glass or a resin. An anisotropic conductive material in which conductive particles are dispersed may be used as the adhesive 32.

When mounting the semiconductor device on the circuit board 36, the first resin protrusion 20 and the second resin protrusion 22 are compressed in opposing directions of the semiconductor device and the circuit board 36. Alternatively, a pressing force is applied to the semiconductor device and the circuit board 36. A pressing force is applied to such an extent that the first interconnects 28 and the second interconnects 30 on the first resin protrusion 20 and the second resin protrusion 22 are electrically connected to the interconnect pattern 34, but the areas (their surfaces) of the first resin protrusion 20 between the adjacent first interconnects 28 do not come in contact with the circuit board 36 and the areas (their surfaces) of the second resin protrusion 22 between the adjacent second interconnects 30 do not come in contact with the circuit board 36. Therefore, a force is applied to the surfaces of the first resin protrusion 20 and the second resin protrusion 22 that overlap (come in contact with) the first interconnects 28 or the second interconnects 30, but is not applied to the surfaces of the first resin protrusion 20 and the second resin protrusion 22 that do not overlap (come in contact with) the first interconnects 28 or the second interconnects 30. This reduces the area to which a force is applied, whereby the area of the integrated circuit 12 affected by an external force is reduced. The adhesive 32 is provided on the areas of the first resin protrusion 20 between the adjacent first interconnects 28 and the areas of the second resin protrusion 22 between the adjacent second interconnects 30. The adhesive 32 is then cured and shrunk by applying heat. The semiconductor device and the circuit board 36 are bonded through the adhesive 32. A pressing force is continuously applied until the adhesive 32 is cured. A pressing force is removed when the adhesive 32 has been cured. The adhesive 32 is cured in a state in which the first resin protrusion 20 and the second resin protrusion 22 are compressed. An electronic device is thus produced.

In this embodiment, the number ($n_1$) of terminals formed using the first resin protrusion 20 and the first interconnects 28 is larger than the number ($n_2$) of terminals formed using the second resin protrusion 22 and the second interconnects 30. However, since the first width $W_1$ is smaller than the second width $W_2$ and the relationship $W_1 \times n_1 = W_2 \times n_2$ is satisfied, the difference between the amounts by which the first resin protrusion 20 and the second resin protrusion 22 are deformed can be reduced (can be reduced to zero by calculations).

Figure 6A:
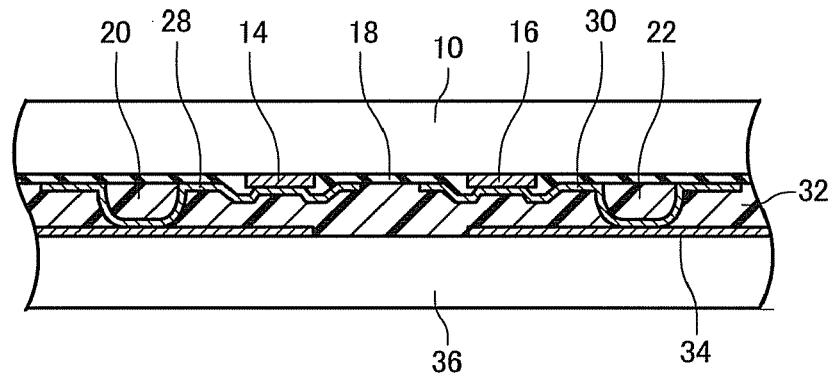
FIGS. 6A to 6C are diagrams illustrative of an electronic device according to the first embodiment of the invention.
Figure 6B:
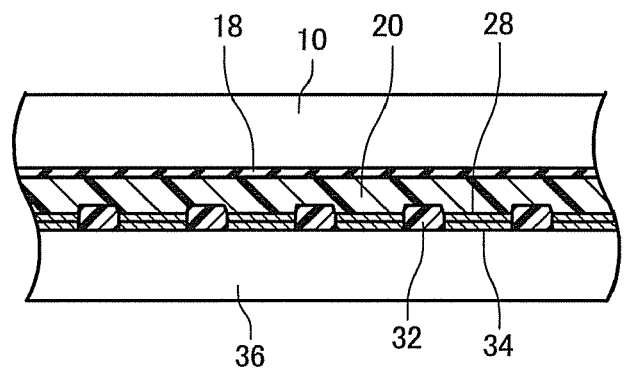
Figure 6C:
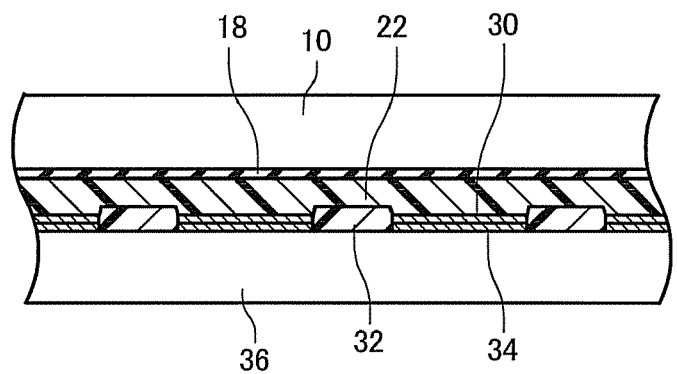

FIGS. 6A to 6C are diagrams illustrative of an electronic device according to the first embodiment of the invention. Note that the semiconductor device shown in FIG. 6A corresponds to the cross section along the line II-II in FIG. 1 (FIG. 2), the semiconductor device shown in FIG. 6B corresponds to the cross section along the line III-III in FIG. 1 (FIG. 3), and the semiconductor device shown in FIG. 6C corresponds to the cross section along the line IV-IV in FIG. 1 (FIG. 4).

The electronic device includes the above-described semiconductor device and the above-described circuit board 36. The adhesive 32 that has been cured is positioned between the semiconductor substrate 10 and the circuit board 36. The first resin protrusion 20 and the second resin protrusion 22 are disposed in a state in which the first resin protrusion 20 and the second resin protrusion 22 are compressed in opposing directions of the semiconductor device and the circuit board 36. The adhesive 32 contains a residual stress due to shrinkage during curing. The areas between the adjacent first interconnects 28 and the areas between the adjacent second interconnects 30 do not come in contact with the circuit board 36. The adhesive 32 is partially disposed between the circuit board 36 and the areas of the first resin protrusion 20 between the adjacent first interconnects 28. The adhesive 32 is partially disposed between the circuit board 36 and the areas of the second resin protrusion 22 between the adjacent second interconnects 30.

Figure 7:
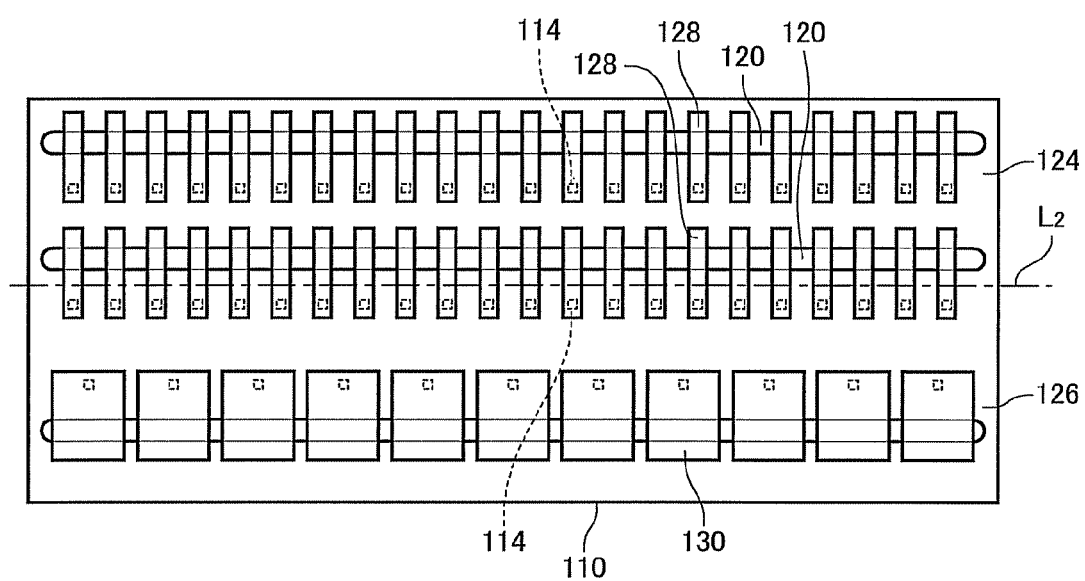
FIG. 7 is a plan view showing a semiconductor device according to a second embodiment of the invention.
Figure 8:
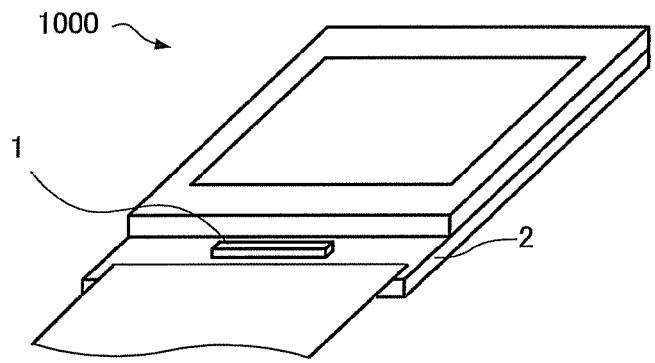
FIG. 8 shows an electronic device using a semiconductor device according to one embodiment of the invention.

FIG. 7 is a plan view showing a semiconductor device according to a second embodiment of the invention. In this embodiment, a plurality of (two in FIG. 7) first resin protrusions 120 are disposed in parallel in a first area 124 of a semiconductor substrate 110 (rectangular surface), the semiconductor substrate 110 being divided into the first area 124 and a second area 126 by a straight line $L_2$ that passes through the center of the semiconductor substrate 110. A plurality of first electrodes 114 are arranged in a plurality of parallel rows (two rows in FIG. 7). The first electrodes 114 need not be disposed in the first area 124. The number of first resin protrusions 120 and the number of first electrodes 114 may be identical, as shown in FIG. 7, or the number of first resin protrusions 120 may be larger or smaller than the number of first electrodes 114. At least one row of first electrodes 114 is positioned between the adjacent first resin protrusions 120. As a modification, all of the first electrodes 114 may be disposed to avoid the area between the adjacent first resin protrusions 120. At least one row of first electrodes 114 may be disposed in the second area 126. $n_1$ first interconnects 128 are disposed in a plurality of rows (two rows in FIG. 7). The number of first electrodes 114 and the number of first interconnects 128 may be the same (see FIG. 7) or different. The description relating to the first area 124, the first electrode 114, and the first interconnect 128 may be applied to the second area 126, a second electrode 116, and a second interconnect 130. The description relating to the first embodiment applies to other details of the second embodiment. One first interconnect 128 may be formed from one first electrode 114 to extend over a plurality of first resin protrusions 120. This also applies to the second interconnect 130.

Figure 9:
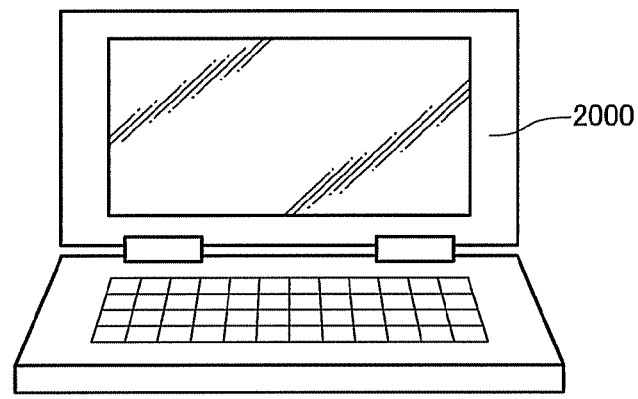
FIG. 9 shows another electronic device using a semiconductor device according to one embodiment of the invention.
Figure 10:
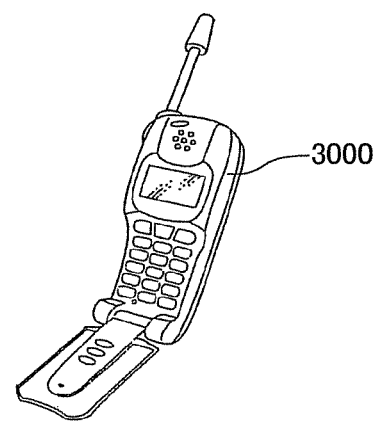
FIG. 10 shows yet another electronic device using a semiconductor device according to one embodiment of the invention.

The electronic device may be a display device (panel module). The display device may be a liquid crystal display device, an electroluminescence (EL) display device, or the like. FIG. 5 shows an electronic device 1000 configured as a display device. The semiconductor device 1 used in the electronic device 1000 is a driver IC that controls the display device. FIGS. 9 and 10 respectively show a notebook-type personal computer 2000 and a portable telephone 3000 as electronic instruments including the electronic device 1000.

The invention is not limited to the above-described embodiments. Various modifications and variations may be made. For example, the invention includes various other configurations substantially the same as the configurations described in the embodiments (such as a configuration having the same function, method, and results, or a configuration having the same objective and results). The invention also includes a configuration in which an unsubstantial section (part) described in the embodiments is replaced by another section (part). The invention also includes a configuration having the same effects as those of the configurations described in the embodiments, or a configuration capable of achieving the same objective as that of the configurations described in the embodiments. Further, the invention includes a configuration in which a known technique is added to the configurations described in the embodiments. For example, an interconnect (not shown) that is not connected to the first electrodes 14 and the second electrodes 16 may be formed in addition to the first interconnects 28 and the second interconnects 30.

Although only some embodiments of this invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A semiconductor device comprising:

a semiconductor substrate on which an integrated circuit is formed, a surface of the semiconductor substrate being divided into a first area and a second area by a straight line that passes through the center of the surface of the semiconductor substrate;

a plurality of first electrodes and a plurality of second electrodes formed on the semiconductor substrate so that the first and second electrodes are electrically connected to the integrated circuit;

at least one first resin protrusion disposed in the first area;

at least one second resin protrusion disposed in the second area, the first and second resin protrusions being formed of an identical material, having an identical width, and extending longitudinally;

$n_1$ first interconnects (n is an integer larger than one) respectively formed on the first electrodes and extending over the first resin protrusion to intersect a longitudinal axis of the first resin protrusion, each of the $n_1$ first interconnects having a first width $W_1$ on the first resin protrusion; and $n_2$ second interconnects ($n_2 < n_1$) respectively formed on the second electrodes and extending over the second resin protrusion to intersect a longitudinal axis of the second resin protrusion, each of the $n_2$ second interconnects having a second width $W_2$ ($W_1 < W_2$) on the second resin protrusion, and the relationship $W_1 \times n_1 = W_2 \times n_2$ being satisfied.

2. The semiconductor device as defined in claim 1, the first interconnects being spaced and formed on an upper surface of the first resin protrusion opposite to the semiconductor substrate;

the second interconnects being spaced and formed on an upper surface of the second resin protrusion opposite to the semiconductor substrate;

part of the upper surface of the first resin protrusion between every adjacent two of the first interconnects being formed to be closer to the semiconductor substrate than part of the upper surface of the first resin protrusion directly under the first interconnects; and part of the upper surface of the second resin protrusion between every adjacent two of the second interconnects being formed to be closer to the semiconductor substrate than part of the upper surface of the second resin protrusion directly under the second interconnects.

3. The semiconductor device as defined in claim 2, the first resin protrusion being formed to have a bottom surface that is larger than the upper surface of the first resin protrusion; and the second resin protrusion being formed to have a bottom surface that is larger than the upper surface of the second resin protrusion.

4. The semiconductor device as defined in claim 1, the semiconductor substrate having a shape of a rectangle;

the first resin protrusion being disposed so that a first side of the rectangle is closest to the first resin protrusion among the sides of the rectangle; and the second resin protrusion being disposed so that a second side of the rectangle that is opposite to the first side is closest to the second resin protrusion among the sides of the rectangle.

5. An electronic device comprising a semiconductor, the semiconductor device including:

a semiconductor substrate on which an integrated circuit is formed, a surface of the semiconductor substrate being divided into a first area and a second area by a straight line that passes through the center of the surface of the semiconductor substrate;

a plurality of first electrodes and a plurality of second electrodes formed on the semiconductor substrate so that the first and second electrodes are electrically connected to the integrated circuit;

at least one first resin protrusion disposed in the first area;

at least one second resin protrusion disposed in the second area, the first and second resin protrusions being formed of an identical material, having an identical width, and extending longitudinally;

$n_1$ first interconnects (n is an integer larger than one) respectively formed on the first electrodes and extending over the first resin protrusion to intersect a longitudinal axis of the first resin protrusion, each of the $n_1$ first interconnects having a first width $W_1$ on the first resin protrusion; and $n_2$ second interconnects ($n_2 < n_1$) respectively formed on the second electrodes and extending over the second resin protrusion to intersect a longitudinal axis of the second resin protrusion, each of the $n_2$ second interconnects having a second width $W_2$ ($W_1 < W_2$) on the second resin protrusion, and the relationship $W_1 \times n_1 = W_2 \times n_2$ being satisfied; and the electric device further comprising:

a circuit board on which an interconnect pattern is formed and the semiconductor device is mounted, the interconnect pattern being faced with and electrically connected to the first interconnects and the second interconnects; and an adhesive provided between the semiconductor device and the circuit board.

6. The electronic device as defined in claim 5, the first resin protrusion and the second resin protrusion being compressed in a direction in which the semiconductor device and the circuit board are faced with each other.

7. The electronic device as defined in claim 5, the first interconnects being spaced and formed on an upper surface of the first resin protrusion opposite to the semiconductor substrate;

the second interconnects being spaced and formed on an upper surface of the second resin protrusion opposite to the semiconductor substrate;

part of the upper surface of the first resin protrusion between every adjacent two of the first interconnects being formed to be closer to the semiconductor substrate than part of the upper surface of the first resin protrusion directly under the first interconnects;

part of the upper surface of the second resin protrusion between every adjacent two of the second interconnects being formed to be closer to the semiconductor substrate than part of the upper surface of the second resin protrusion directly under the second interconnects; and part of the upper surface of the first resin protrusion between every adjacent two of the first interconnects and part of the upper surface of the second resin protrusion between every adjacent two of the second interconnects being apart from the circuit board.

8. A method of producing an electronic device comprising:

mounting a semiconductor device on a circuit board on which an interconnect pattern is formed, the semiconductor device including:

a semiconductor substrate on which an integrated circuit is formed, a surface of the semiconductor substrate being divided into a first area and a second area by a straight line that passes through the center of the surface of the semiconductor substrate;

a plurality of first electrodes and a plurality of second electrodes formed on the semiconductor substrate so that the first and second electrodes are electrically connected to the integrated circuit;

at least one first resin protrusion disposed in the first area;

at least one second resin protrusion disposed in the second area, the first and second resin protrusions being formed of an identical material, having an identical width, and extending longitudinally;

$n_1$ first interconnects (n is an integer larger than one) respectively formed on the first electrodes and extending over the first resin protrusion to intersect a longitudinal axis of the first resin protrusion, each of the $n_1$ first interconnects having a first width $W_1$ on the first resin protrusion; and $n_2$ second interconnects ($n_2 < n_1$) respectively formed on the second electrodes and extending over the second resin protrusion to intersect a longitudinal axis of the second resin protrusion, each of the $n_2$ second interconnects having a second width $W_2$ ($W_1 < W_2$) on the second resin protrusion, and the relationship $W_1 \times n_1 = W_2 \times n_2$ being satisfied;

the method further comprising:

causing the interconnect pattern to be faced with the first and second interconnects and electrically connecting the interconnect pattern to the first and second interconnects; and bonding the semiconductor device and the circuit board through an adhesive.

9. The method of producing an electronic device as defined in claim 8, wherein the first resin protrusion and the second resin protrusion are compressed in a direction in which the semiconductor device and the circuit board are faced with each other when mounting the semiconductor device on the circuit board; and wherein the adhesive is cured in the step of bonding the semiconductor device and the circuit board through the adhesive in a state in which the first resin protrusion and the second resin protrusion are compressed.

* * * * *